US009147851B1

(12) United States Patent
Bartsch et al.

(10) Patent No.: US 9,147,851 B1
(45) Date of Patent: Sep. 29, 2015

(54) DNA-CONJUGATED POLYMER VARACTORS (71) Applicant: The United States of America as represented by the Secretary of the Air Force, Washington, DC (US)

(72) Inventors: Carrie M. Bartsch, Beavercreek, OH (US); Jack P. Lombardi, III, Manlius, NY (US); Roberto S. Aga, Jr., Beavercreek, OH (US)

(73) Assignee: The United States of America as represented by the Secretary of the Air Force, Washington, DC (US)

( * ) Notice: Subject to any disclaimer, the term of this patent is extended or adjusted under 35 U.S.C. 154(b) by 0 days.

(21) Appl. No.: 14/303,627

(22) Filed: Jun. 13, 2014

Related U.S. Application Data (60) Provisional application No. 61/835,852, filed on Jun. 17, 2013.

(51) Int. Cl.
*H01L 29/93* (2006.01)
*H01L 51/52* (2006.01)
*H01L 51/56* (2006.01)
*H01L 51/00* (2006.01)
*H01L 51/05* (2006.01)

(52) U.S. Cl.
CPC ........ *H01L 51/0093* (2013.01); *H01L 51/0036* (2013.01); *H01L 51/0038* (2013.01); *H01L 51/0595* (2013.01)

(58) Field of Classification Search
CPC .......... H01L 29/93; H01L 51/52; H01L 51/56
See application file for complete search history.

(56) References Cited

U.S. PATENT DOCUMENTS

| 8,008,930 | B2 | 8/2011 | Subramanyam |
| 8,093,802 | B1* | 1/2012 | Grote ............................. 313/504 |
| 8,709,290 | B2* | 4/2014 | Tierney et al. ................ 252/500 |
| 2004/0201040 | A1* | 10/2004 | Fujihara et al. ............... 257/200 |
| 2005/0112621 | A1* | 5/2005 | Kim et al. .......................... 435/6 |
| 2006/0172408 | A1* | 8/2006 | Quake et al. ............... 435/287.2 |
| 2007/0030623 | A1* | 2/2007 | Clemens et al. ............. 361/281 |
| 2007/0138463 | A1* | 6/2007 | Herlogsson et al. ........... 257/40 |
| 2008/0169464 | A1* | 7/2008 | Gong et al. ..................... 257/40 |
| 2009/0311799 | A1* | 12/2009 | Sotzing et al. ................ 436/172 |
| 2010/0008825 | A1* | 1/2010 | Subramanyam .......... 422/82.02 |
| 2010/0066389 | A1* | 3/2010 | Subramanyam ............. 324/658 |
| 2010/0270174 | A1* | 10/2010 | Chen et al. ................. 205/777.5 |

(Continued)

OTHER PUBLICATIONS

Bartsch et at., Response of Varactors Containing DNA-Conjugated Polymer, IEEE International Midwest Symposium on Circuits and Systems, Aug. 6, 2012.

(Continued)

*Primary Examiner* — Tan N Tran
*Assistant Examiner* — Fazli Erdem
(74) *Attorney, Agent, or Firm* — AFMCLO/JAZ; Jason Sopko (57) ABSTRACT

A variable capacitor includes a first metal layer. The variable capacitor further includes a deoxyribonucleic acid-based (DNA-based) biopolymer layer including an organic component and a surfactant. The DNA-based biopolymer layer is adjacent the first metal layer. The variable capacitor further includes a conjugated polymer layer adjacent the DNA-based biopolymer layer and a second metal layer adjacent the conjugated polymer layer.

6 Claims, 5 Drawing Sheets

(56) References Cited

U.S. PATENT DOCUMENTS

| | | | | |
|---|---|---|---|---|
| 2010/0288343 | A1* | 11/2010 | Sotzing et al. | 136/252 |
| 2011/0108952 | A1* | 5/2011 | Chen | 257/595 |
| 2011/0178236 | A1* | 7/2011 | Tierney et al. | 524/589 |
| 2012/0305853 | A1* | 12/2012 | Mitchell et al. | 252/500 |
| 2013/0320305 | A1* | 12/2013 | Hung et al. | 257/40 |
| 2014/0145735 | A1* | 5/2014 | Koester | 324/686 |
| 2014/0312879 | A1* | 10/2014 | Torsi et al. | 324/76.11 |

OTHER PUBLICATIONS

Bartsch, Development of a Field Effect Transistor Using a DNA-Biopolymer as the Semiconducting Layer, University of Dayton Dissertation, Aug. 2007.

Bartsch et al., A new capacitive test structure for microwave characterization of biopolymers, Microwave and Optical Technology Letters,, vol. 49, No. 6, pp. 1261-1265, Jun. 6, 2007.

* cited by examiner

Fig. 1

| Au (350nm) |
|---|
| DNA-CTMA (1μm) |
| P3HT (~20nm) |
| Au (750nm) |
| Cr (10nm) |
| High Resistivity Substrate |

Substrate #1

| Au (350nm) |
|---|
| P3HT (~20nm) |
| DNA-CTMA (1μm) |
| Au (750nm) |
| Cr (10nm) |
| High Resistivity Substrate |

Substrate #2

| Au (350nm) |
|---|
| PVOH (1μm) |
| P3HT (~20nm) |
| Au (750nm) |
| Cr (10nm) |
| High Resistivity Substrate |

Substrate #3

| Au (350nm) |
|---|
| DNA-CTMA (1μm) |
| Au (750nm) |
| Cr (10nm) |
| High Resistivity Substrate |

Substrate #4

DNA-CONJUGATED POLYMER VARACTORS

Pursuant to 37 C.F.R. §1.78(a)(4), this application claims the benefit of and priority to prior filed Provisional Application Ser. No. 61/835,852, filed 17 Jun. 2013, which is expressly incorporated herein by reference.

RIGHTS OF THE GOVERNMENT

The invention described herein may be manufactured and used by or for the Government of the United States for all governmental purposes without the payment of any royalty.

FIELD OF THE INVENTION

The present invention relates generally to semiconductor devices. More particularly, the disclosed invention relates to materials for use with, and fabrication of, variable capacitors.

BACKGROUND OF THE INVENTION

Varactors, or variable capacitors, are very useful for radio frequency (RF) applications by creating a device whose capacitance can be varied. Thus, the device may be used for tuning and impedance matching, increasing the efficiency and performance in RF systems. These devices can be made with a variety of materials and have many different topologies, but usually have a change in capacitance due to an applied DC voltage. In making RF varactors, a common topology allowed for relatively easy fabrication, testing, and integration with other RF components, and could be used with a variety of materials. The materials that were used traditionally included a single one component, such as barium titanate, poly methyl methacrylate (PMMA), or deoxyribonucleic acid hexacetyltrimethyl-ammonium chloride (DNA-CTMA).

However, prior art varactors are often limited to implementation on rigid substrates. Additionally, prior art varactors may have a somewhat limited range of optical and electrical design ranges.

Therefore, there exists a need for flexible varactor materials that may be configured for use on substrates such as plastic or other resilient planes. Further, there exists a need for varactor materials that may be synthesized to have desired optical and electrical properties.

SUMMARY OF THE INVENTION

The present invention overcomes the foregoing problems and other shortcomings, drawbacks, and limitations of prior art ridged substrates. While the invention will be described in connection with certain embodiments, it will be understood that the invention is not limited to these embodiments. To the contrary, this invention includes all alternatives, modifications, and equivalents as may be included within the spirit and scope of the present invention.

According to one embodiment of the present invention, a variable capacitor is provided. The variable capacitor includes a first metal layer. The variable capacitor further includes a deoxyribonucleic acid-based (DNA-based) biopolymer layer including an organic component and a surfactant. The DNA-based biopolymer layer is adjacent the first metal layer. The variable capacitor further includes a conjugated polymer layer adjacent the DNA-based biopolymer layer and a second metal layer adjacent the conjugated polymer layer.

Additional objects, advantages, and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

BRIEF DESCRIPTION OF THE DRAWINGS

The accompanying drawings, which are incorporated in and constitute a part of this specification, illustrate embodiments of the present invention and, together with a general description of the invention given above, and the detailed description of the embodiments given below, serve to explain the principles of the present invention.

It should be understood that the appended drawings are not necessarily to scale, presenting a somewhat simplified representation of various features illustrative of the basic principles of the invention. The specific design features of the sequence of operations as disclosed herein, including, for example, specific dimensions, orientations, locations, and shapes of various illustrated components, will be determined in part by the particular intended application and use environment. Certain features of the illustrated embodiments have been enlarged or distorted relative to others to facilitate visualization and clear understanding. In particular, thin features may be thickened, for example, for clarity or illustration.

DETAILED DESCRIPTION OF THE INVENTION

The operation of the varactor is seen by observing a change in the microwave S-parameters of the device. The conjugated polymer used in the disclosed invention may be poly (3-hexylthiophene-2,5-diyl) (P3HT) and the DNA-based biopolymer may be DNA-CTMA. Other ionic surfactants, particularly cationic surfactants in addition to CTMA, may be used as long as they meet processing objectives and are chemically compatible with adjacent layers. The results are compared to both the baseline DNA-based biopolymer and the conjugated polymer layer added to a layer of polyvinyl alcohol. The addition of the conjugated polymer layer underneath the DNA-based biopolymer has been found to significantly improve the stability and dielectric tuning of the DNA-based biopolymer.

Stability, defined herein as the ability of a tested varactor to return to its previous scattering parameter values (S-parameters, specifically S11 and S21) upon removal of an applied bias and over a large number of cycles, compares the original DNA to the DNA-conjugated polymer device. Compared to the stability of the original DNA-CTMA only device, the DNA-conjugated polymer device shows a smaller, more consistent change in S21 with the initial application of the DC bias, as well as a more consistent, repeatable change in S21 as the bias is cycled in subsequent measurements.

The ability to easily measure and consistently reproduce changes in the dielectric properties of polymers over a wide frequency range may be important in the design of tunable microwave devices. A tunable RF capacitor is one example of a tunable microwave device, and the use of such a capacitor in matching networks for antennas and amplifiers yields more efficient power handling. Barium strontium titanate (BST), a ferroelectric material, may be currently one of the most intensively studied materials for this application. However, the high temperature growth and rigid substrates necessary for BST growth will likely prove unsuitable for flexible electronics. As such, there may be a need to branch out to new electronic materials with greater mechanical flexibility and lower temperature processing that maintain high dielectric tuning similar to that seen in BST.

One potentially promising material for tunable RF capacitors in flexible electronics may be deoxyribonucleic acid (DNA)-based biopolymers. Some of the favorable properties of DNA-based biopolymers include flexibility, light weight, low cost, low temperature processing, ease of fabrication, and easily modifiable properties. For example, since the disclosed invention may be fabricated with low temperature processing techniques, devices may be printed on demand (using ink jet or other additive manufacturing processes) for rapid prototyping. Additionally, existing semiconductor layouts may be modified by printing the disclosed structures thereon. Since no thermal processing is required to generate the disclosed inventive structures, existing layouts are not subjected to additional thermal stresses during such modifications.

The dielectric properties of DNA-based biopolymers are characterized at microwave frequencies using various structures including coplanar waveguide test fixtures and variable capacitors (varactors) in the form of capacitive test structures, and these biopolymers exhibit dielectric tuning through the application of a DC bias voltage. Thus far, most of the DNA-based biopolymer work has been done using DNA precipitated with a cationic surfactant such as hexadecyltrimethyl ammonium chloride (CTMA), which is called DNA-CTMA. Unfortunately, DNA-CTMA has a memory effect that appears as dielectric hysteresis, which may be more pronounced under negative bias and needs to be resolved before these materials can be successfully used in electronic devices.

Conjugated polymers are a class of organic materials exhibiting the ability to exist in multiple redox states and be transitioned from an insulator to a semiconductor. Since these materials are chemically prepared, their valence and conduction band energies can be varied by changing chemical composition. Conjugated polymers have been utilized in many applications with some of these encompassing optically transparent electrodes, hole blocking layers for organic light emitting diodes, photovoltaic devices, electrochromic windows and mirrors, transistors, and chemical sensors to name a few. Many conjugated polymers, such as polythiophenes, can be doped by removing electrons from the valence band generating hole charge carriers.

Conjugated polymers could play an important role in varactors in that they are flexible materials that can be easily processed by solution-based techniques such as spray, spin, dip or flow coating as well as ink jet printing or aerosol jet printing. Use of such materials allows for the exclusion of silicon or other inflexible substrates. Further, through chemical structure variation, the band energies of conjugated polymers can be modified such that they bridge the gap between the metallic and dielectric junctions in a varactor. In addition, they may provide a better mechanical interface between the conductor and dielectric. The capacitive test structure (CTS) may be used to analyze the effect of adding a conjugated polymer to a DNA-biopolymer. The Capacitive Test Structure (CTS) is a variable capacitor (varactor) designed to characterize the dielectric properties of thin films. While the CTS is a useful test structure for evaluating various variable capacitor or varactor configurations, the terms CTS, Variable Capacitor, varactor, or varicap may be used interchangeably herein to discuss the operating characteristics thereof. Applicant herein compares the results from just the DNA-biopolymer (DNA-CTMA) with those of the conjugated polymer underneath the DNA-biopolymer, the DNA-biopolymer underneath the conjugated polymer, and the conjugated polymer underneath a reference polymer (polyvinyl alcohol, PVOH).

Figure 1:
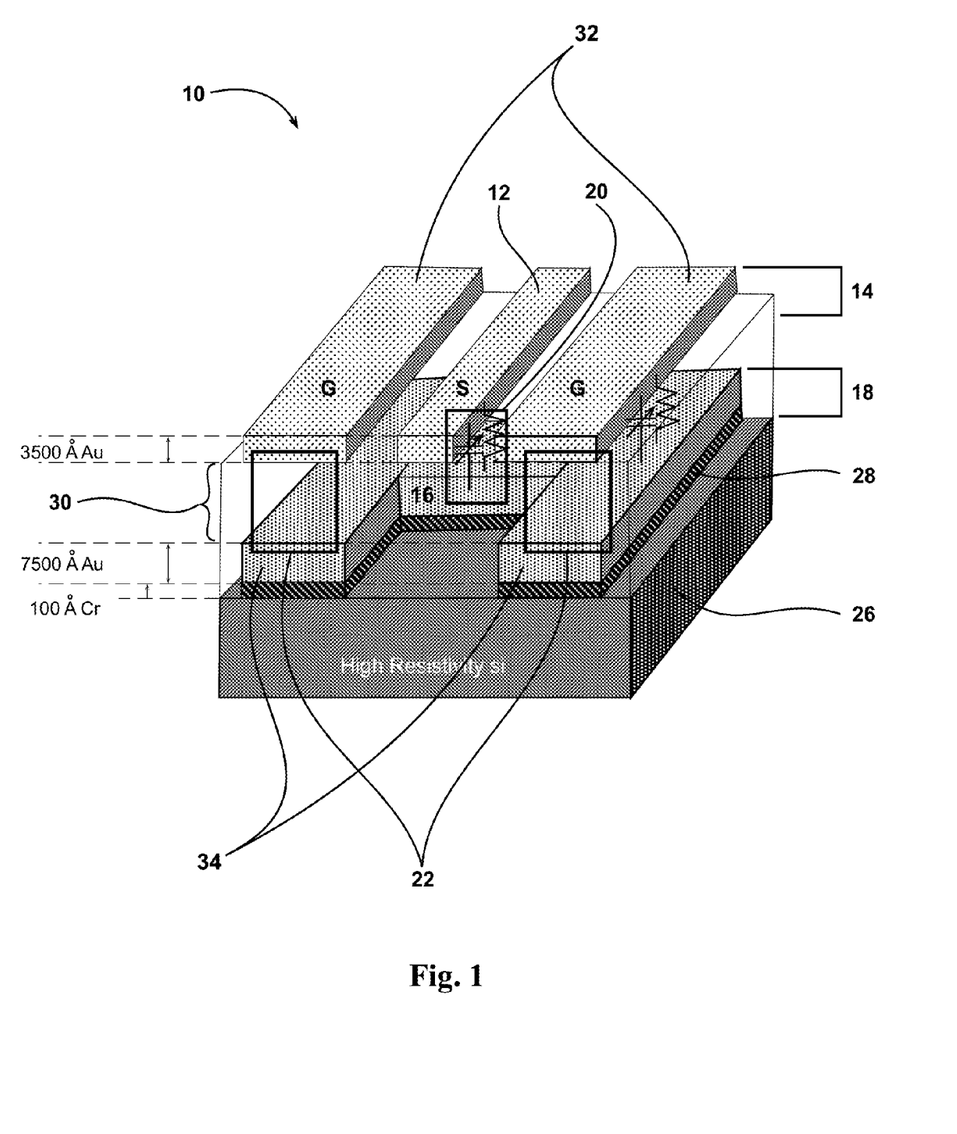
FIG. 1 is a cross sectional view of an embodiment of the disclosed invention.

FIG. 1 is a three dimensional representation of the CTS 10, which is configured to evaluate various varactor design configuration. In the embodiment of FIG. 1, the illustration of the CTS 10 shows the overlap of the signal conductor 12 in the top-metal region 14 and the shunt line 16 in the bottom metal region 18 that form the test variable capacitor 20. The large ground pad capacitors, 22 may be in series with the test capacitor 20. The current from a DC bias applied to the signal conductor 12 in this structure passes through the test variable capacitor 20, the shunt line 16 in the bottom metal region 18, and the leakage conductance of the ground pad capacitors 22. Therefore, the two capacitors (test variable capacitor 20 and ground pad capacitor 22) that are adjacent to each other in the device are electrically in series, and arrows indicate the path of the current to ground. Since the leakage conductance of the ground pad capacitors 22 is significantly larger than that of the test variable capacitor 20, the net capacitance seen is effectively that of the test variable capacitor 20, resulting in approximately equivalent capacitance of the test variable capacitor 20 being attached to the signal conductor 12.

The CTS 10 may be comprised of four layers deposited on a high resistivity substrate 26 as seen in FIG. 1. The bottom metal region 18 may be a patterned "H" shape, consisting of two ground lines shunted together, made from approximately 7500 angstroms of gold on top of an adhesion layer 28. In some embodiments approximately 100 angstroms of chrome is used as an adhesion layer. The dielectric layer 30 may be deposited by spin coating a suitable material between the metal layers. The top metal region 14 may be a coplanar waveguide transmission line, consisting of the signal conductor 12 that may be centered between two lower ground lines 32 (that are above the parallel upper ground lines 34 in the bottom metal region 18). Each of the signal conductor 12 and lower ground lines 32 may be formed with approximately 3500 angstroms of gold. In one embodiment, at least one of the metal layers is deposited using thermal evaporation through a shadow mask.

In some embodiments of the disclosed invention, the dielectric layer 30 may be a DNA-biopolymer that includes a DNA component and a surfactant component. For example, DNA-CTMA may be composed of 1 MDa DNA, processed from any source known in the art. In one embodiment, the DNA-biopolymer, DNA-CTMA, may be composed of a peak average weight of 1 MDa DNA salmon roe or milt sacs, and precipitated with the cationic surfactant CTMA at a ratio of approximately 1:1, which provides an excess amount of CTMA in the complex. This produces the water insoluble biopolymer, DNA-CTMA. DNA-CTMA may be dissolved at approximately 8 wt % (weight percent) in butanol and spin coated at 700 RPM for approximately 60 seconds to obtain an approximately 1 μm thick film. A 5 wt % DNA solution can be made up of 5% by wt of DNA and 95% by wt of the solvent.

It has been observed that good results are achieved with commercially available preparations of DNA having a purity of 98% or higher. An additional constraint of the selected DNA component is that the film resulting from spin casting must be substantially free from pinholes or other defects when applied at the selected rotation speed and application rate.

In some embodiments, the conjugated polymer may be regioregular poly (3-hexylthiophene-2,5-diyl) (P3HT), which may be obtained from Sigma Aldrich® and used as received, or any other conjugated polymer known in the art. The P3HT may be dissolved at approximately 0.03 wt % in chloroform. The P3HT may be spin coated at approximately 2000 RPM for approximately 60 seconds to obtain a film that may be approximately 20 nm thick. It has been observed that acceptable results may also be achieved with the conjugated polymer Poly[2-methoxy-5-(2-ethylhexyloxy)-1,4-phenylenevinylene] (MEH-PPV), but the completed device must be environmentally sealed to achieve durability and longevity values comparable to P3HT.

The reference polymer may be any polymer known in the art including approximately 99.7% hydrolyzed, PVOH with a molecular weight of approximately 78000 Da and may be purchased from Polysciences Inc®. A 1 wt % solution of PVOH in DI water may be prepared, and coated at approximately 2000 RPM for approximately 60 s to obtain a 1 μm thick film.

To test performance of embodiments of the disclosed invention, four different wafers were made using different materials and each variation had 42 CTS 10 devices. Substrate 26 #1, consists of approximately a 1 μm thick layer of DNA-CTMA on top of an approximately 20 nm thick layer of P3HT. Substrate 26 #2 consists of an approximately 20 nm thick layer of P3HT on top of approximately a 1 μm thick layer of DNA-CTMA. Substrate 26 #3 consists of approximately a 1 μm thick layer of PVOH on top of an approximately 20 nm thick layer of P3HT. Substrate 26 #4 is a reference substrate and consists of approximately a 1 μm thick layer of DNA-CTMA with no P3HT layer. The compositions of these four wafers are shown in FIG. 2.

Figure 2:
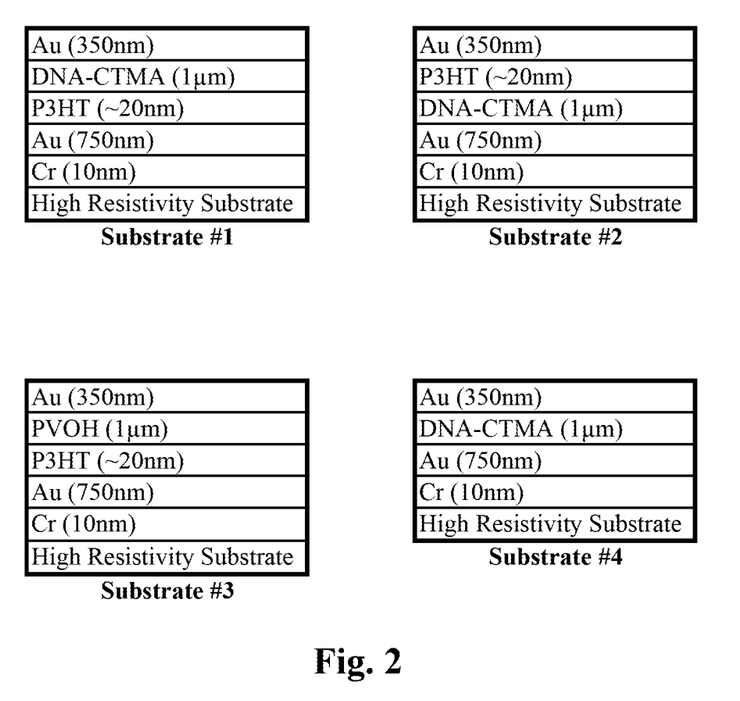
FIG. 2 is a graphical representation of layers comprising embodiments of the disclosed invention.

FIG. 2 is an illustration of a cross-sectional view of four exemplary wafers showing the composition of fabricated devices. The fabricated devices are test variable capacitors 20 with variation applied to the dielectric layer 30. The overlap between the signal line 12 and the shunt line 16 represents a parallel plate capacitor which consists of a capacitance and resistance and makes up the test capacitor 20.

After the polymers are deposited, all the wafers are baked overnight (for approximately 12 hours) in a vacuum oven at approximately 70° C. to drive out the solvent and solidify the film before the top gold layer is deposited. The S-parameters, S21 and S11, are measured to determine the capacitance and dielectric properties of the layered polymers. The measurement set-up may include an HP 8720A Network Analyzer connected to a Keithley® 2420-3A SourceMeter, a Jmicro Technology® LMS-2709 probe station with Cascade Microtech® probes, and a computer running LabView® to automate testing and data collection.

The S-parameter changes are examined and measured by using the difference in the biased S-parameters from the initial 0 V S-parameters. Since the network analyzer may be set to measure the uncalibrated single-frequency data, looking at the change in S-parameters, rather than the raw uncalibrated S-parameters, helps accurately and effectively compare the measurements.

The change in S-parameters due to biasing, as a function of frequency for both applied biases, may be plotted to determine the frequency where the maximum change in S21 occurs. This frequency may be used for subsequent measurements. The relative change in S21 may be measured, since the bias voltage may be incremented first to 5 V bias and then to −5 V bias from 0 V in 0.5 V steps with a 4 second (4000 ms) hold between each increment, and finally cycled through these voltages a number of times.

The relationship between FIG. 1 and FIG. 2 is evident with the illustrations. FIG. 1. is a three dimensional illustration of the present device (the capacitive test structure) containing a generic polymer layer, while FIG. 2 shows the cross-sectional view of the four different devices tested with specific details about the polymer layer included. Thickness affects the sensitivity of measurement, but too thin of a layer causes shorting. Therefore, to get a high change in scattering parameters for a small change in dielectric constant as thin of a dielectric layer as possible is desired. Changes in the spacing and line thicknesses affect the calculations, but not the measured shift. As a result, departures from dimensions disclosed herein may produce desirable results. Since, the thickness of the dielectric layer 30, and each of the components within the dielectric layer 30, may affect the functionality of the CTS 10, as capacitance is inversely proportional to thickness (the distance between the signal and shunt lines that make up the parallel plate capacitor). The fact that the conjugated polymer (P3HT) is thin compared to the DNA-CTMA and PVOH layers may indicate that any bulk transport taking place within the dielectric layer 30 is mostly occurring in the DNA-CTMA. The stabilization provided by these two layers having different thicknesses may be due to interface effects.

The following examples illustrate particular properties and advantages of some of the embodiments of the present invention. Furthermore, these are examples of reduction to practice of the present invention and confirmation that the principles described in the present invention are therefore valid but should not be construed as in any way limiting the scope of the invention.

Figure 3:
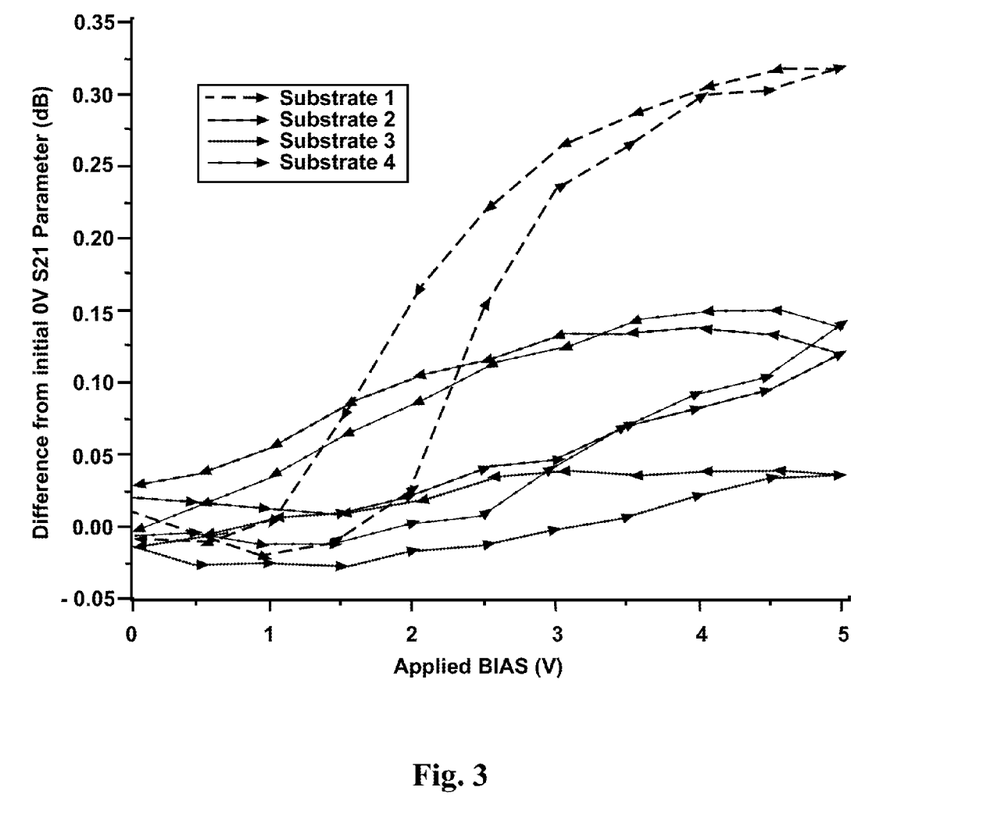
FIG. 3 is a graphical illustration of the change in S parameters at 5 GHz as a function of positive bias for embodiments of the disclosed invention.

FIG. 3 is an illustration of the change in S21 at 5 GHz as a function of positive bias for a representative device on each of the four wafers. All four wafers may show a maximum dielectric tuning over the measured frequency range of 1 to 20 GHz near 5 GHz. Therefore, all of the measurements reported here are taken at approximately 5 GHz. In the CTS 10, S21 may be affected by the size of the capacitance in the test variable capacitor 20. Specifically, as the capacitance increases, more power may be shunted to the ground and thus S21 decreases.

A representative set of measurements showing a single cycle of positive bias sweep, from 0 V to 5 V and back to 0 V, on a single CTS 10 on each substrate 26 can be found in FIG. 3. FIG. 3 shows that the change in S21 may be smallest for substrate 26 #3, slightly larger for substrates #2 and #4, and largest for substrate 26 #1. The devices on all four substrates 26 have hysteresis, with the forward direction from 0 V to 5 V plotting as the lower curve and the reverse direction from 5 V back to 0 V plotting as the upper curve.

The maximum changes in S21 and dielectric constant occur at approximately 5 V for all four substrates 26. Specifically, the maximum change in S21 may be approximately 0.32 dB at about 5.0 V for substrate 26 #1, may be approximately 0.14 dB at about 4.5 V for substrate 26 #2, may be approximately 0.04 dB at about 4 V for substrate 26 #3, and may be approximately 0.15 dB at about 4.5 V for substrate 26 #4. The maximum percent change in dielectric constant may be approximately 10.4% for substrate 26 #1, approximately 4.3% for substrate 26 #2, approximately 1.1% for substrate 26 #3, and approximately 3.7% for substrate 26 #4. Leakage currents are in the 10^-9 amp (nanoamp) range.

FIG. 3 also shows that the fastest change in S21 for substrate 26 #1 occurs near 2 V, while the other substrates 26 all have a slower, more uniform ramp of change in S21.

Figure 4:
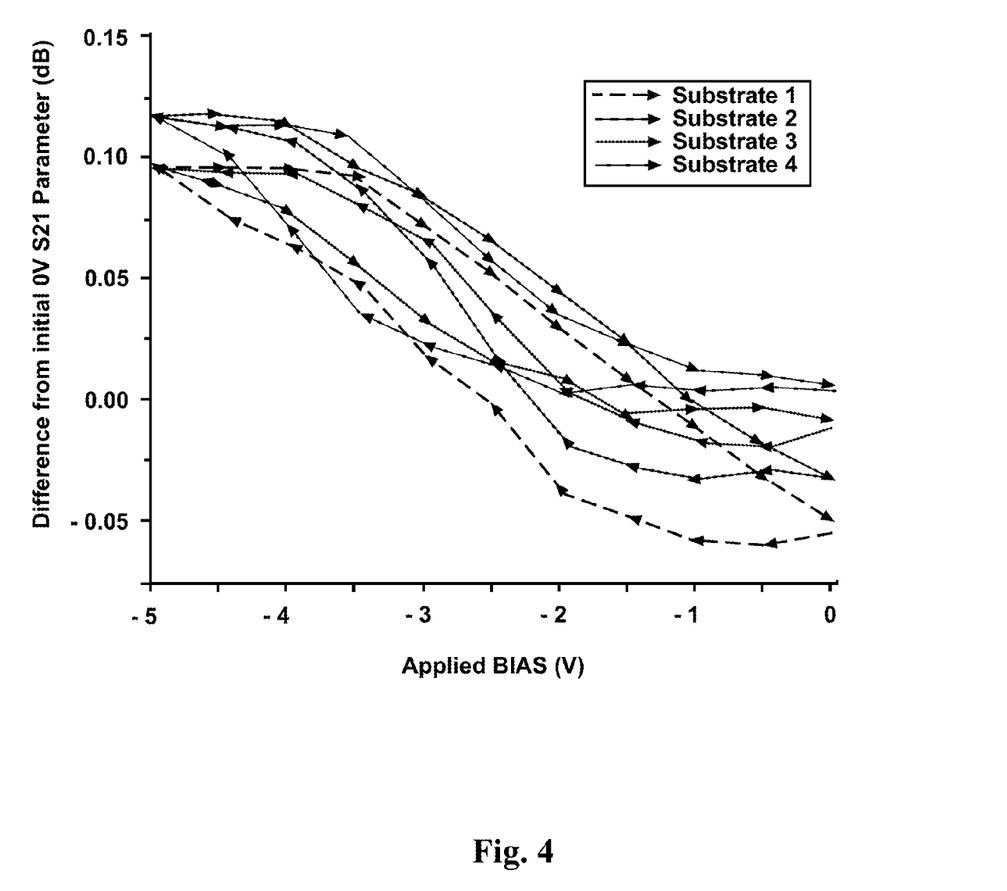
FIG. 4 is a graphical illustration of the change in S parameters at 5 GHz as a function of negative bias for embodiments of the disclosed invention.

A representative set of measurements showing a single cycle of the negative bias sweep from approximately 0 V to approximately −5 V and back to approximately 0 V on a single CTS 10 on each substrate 26 is illustrated in FIG. 4. FIG. 4 shows that the change in S21 given a negative bias is approximately the same for all four substrates 26. All four substrates 26 show hysteresis, with the forward direction from 0 V to −5 V plotting as the lower curve and the reverse direction from −5 V back to 0 V plotting as the upper curve. However, substrate 26 #4, consisting of just a DNA-CTMA polymer, has the most unusual hysteresis curve with the data at −2 V showing an almost identical change for the forward and reverse paths.

FIG. 4. further illustrates a plot of the change in S21 at 5 GHz as a function of negative bias for a representative device on each of the four wafers. The maximum changes in S21 and dielectric constant occur at approximately −5 V for all four substrates 26. Specifically, the maximum change in S21 for substrates 26 #1 and #4 may be approximately 0.10 dB, and for substrates 26 #2 and #3 may be approximately 0.12 dB. The maximum percent change in dielectric constant may be approximately 3.2% for substrate 26 #1, may be approximately 3.7% for substrate 26 #2, may be approximately 2.2% for substrate 26 #3, and may be approximately 2.8% for substrate 26 #4. The leakage currents are observed in the nanoamp range, with a maximum of approximately 15 nA. FIG. 4 also shows that the relative change in S21 is substantially consistent across the four substrates 26 in the negative bias. Additionally, from the data, the cycling of bias sweeps on various devices on substrate 26 #1 show that the bias data may be repeatable and consistent over ten cycles for both the positive and negative biases, while the devices on substrates 26 #2, #3, and #4 show changes in the S21 values for each bias value over the first several cycles and then the S21 values stabilize over the cycle. To quantitatively display the stability seen on substrate 26 #1, data was averaged at each bias point over the cycles measured.

Figure 5:
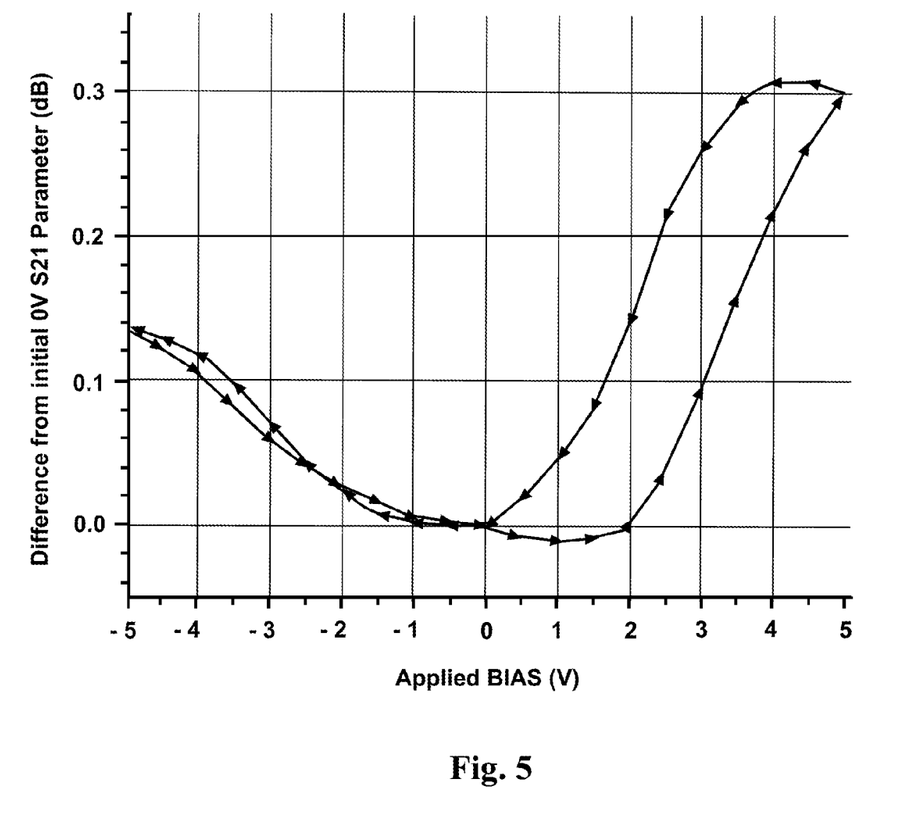
FIG. 5 is a graphical illustration depicting the average of a plurality of bias sweeps applied to embodiments of the disclosed invention.

Twenty cycles of bias sweeps were measured on a device on substrate 26 #1, the data at each point was averaged and plotted in FIG. 5. It should be noted that the standard deviation for each of these points is observed to be less than approximately 0.018, which confirms that the devices on substrate 26 #1 are stable under varying bias conditions. Thus, DNA-CTMA on top of a layer of P3HT has been shown to be a stable material with dielectric tunability that could prove very useful in tunable microwave devices.

The standard deviations on devices from the other three substrates 26 are significantly larger than those shown in FIG. 5 due to both the ramping up of the measured dielectric tuning and the inconsistencies within the dielectric tuning.

Based upon the above results, the addition of a P3HT layer underneath the DNA-CTMA layer may increase the dielectric tuning, the repeatability of S21 measurements, and the stability of S21 measurements over several cycles of bias sweeps. The mechanism causing the dielectric tuning may be this polymer combination, and more likely the DNA-CTMA and P3HT interface. This interface does not appear to exist for either the DNA-CTMA polymer nor for the PVOH and P3HT stack.

FIG. 5. further illustrates a plot of averaged data from 20 cycles of voltage sweeps for both positive and negative bias. It should be noted that in both cases, the sweep away from 0 V is the lower curve and the sweep back to 0 V is the upper curve. Additionally, these curves were taken sequentially on the same device with the positive bias sweep measured first.

When the P3HT layer is deposited on top of the DNA-CTMA, the interface is at least partly different from that when the DNA-CTMA is deposited on top of the P3HT due to the interaction of the selected solvents with the polymers. Specifically, butanol which may be used to dissolve the DNA-CTMA does not interact with the P3HT layer, while chloroform which is used to dissolve the P3HT may cause changes in the DNA-CTMA layer.

As discussed above, as the S-parameters are measured over several cycles of bias sweeps for devices on substrates 26 #2, #3, and #4, the amount that S21 changes depends heavily upon the number of cycles that have occurred immediately before the current cycle. The initial increase over the first several cycles may be partially caused by the motion of free ions in the polymer material due to the applied electric field. This electric field is generated by the DC bias voltage applied to signal conductor 12, and will cause any free ions in the polymer materials to be attracted towards the signal lines 12, thereby increasing the free charges at the surface in one embodiment. This charge redistribution may be immediately reversed when the applied field is removed, and therefore this initial increase may be measured at the beginning of every set of measurements. Substrate 26 #1, with the P3HT layer below the DNA-CTMA layer, does not have this increase in dielectric tuning over the first several cycles, and this is likely because the interface between the DNA-CTMA and the P3HT provides a much stronger dielectric tuning mechanism than the motion of ions seen in the other structures.

Additionally, it should be noted that even substrate 26 #3, the designed control for this development consisting of a PVOH layer on top of the P3HT layer, shows minimal dielectric tuning under both positive and negative bias conditions. This could be due to the conductive nature of P3HT, as it is a semiconducting polymer. More importantly for the disclosed invention, however, may be that while the DNA-CTMA alone as well as the P3HT with a generic polymer both show some dielectric tuning, neither one has the stable dielectric tuning disclosed herein on the DNA-CTMA on top of P3HT.

The dielectric tuning of DNA-CTMA within a CTS device may be strengthened at least in part by the use of an approximately 20 nm P3HT layer underneath the DNA-CTMA, typically producing a change in dielectric tuning of approximately 0.3 dB. This addition of a P3HT layer to the DNA-CTMA produces a stronger tuning than that seen in the DNA-CTMA, and this characteristic may be due to the interface of the two materials along with the free ions within the DNA. The interface between P3HT and DNA-CTMA has a much stronger dielectric tuning than that caused by the free CTMA ions in the DNA-CTMA. The tuning caused by this interface may be stronger and more stable than the tuning in any of the other polymers or combinations of polymers considered here.

While the present invention has been illustrated by a description of one or more embodiments thereof and while these embodiments have been described in considerable detail, they are not intended to restrict or in any way limit the scope of the appended claims to such detail. Additional advantages and modifications will readily appear to those skilled in the art. The invention in its broader aspects is therefore not limited to the specific details, representative apparatus and method, and illustrative examples shown and described. Accordingly, departures may be made from such details without departing from the scope of the general inventive concept.

What is claimed is:

1. A variable capacitor comprising;
a first metal layer;
a deoxyribonucleic acid-based (DNA-based) biopolymer layer including an organic component and a surfactant, wherein the DNA-based biopolymer layer is adjacent the first metal layer;
a conjugated polymer layer adjacent the DNA-based biopolymer layer; and
a second metal layer adjacent the conjugated polymer layer.

2. The variable capacitor of claim 1, wherein the conjugated polymer is Poly(3-hexylthiophene-2,5-diyl).

3. The variable capacitor of claim 1, wherein the the conjugated polymer is Poly[2-methoxy-5-(2-ethylhexyloxy)-1,4-phenylenevinylene].

4. The variable capacitor of claim 1, wherein the surfactant is cationic.

5. The variable capacitor of claim 4, wherein the surfactant is hexacetyltrimethyl-ammonium chloride.

6. The variable capacitor of claim 5, wherein the conjugated polymer is Poly(3-hexylthiophene-2,5-diyl).

* * * * *